US011956922B2

(12) United States Patent
Gao

(10) Patent No.: US 11,956,922 B2
(45) Date of Patent: Apr. 9, 2024

(54) MULTIPLE CHAMBERS CONNECTION MODULE FOR COOLING STREAMS

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 200 days.

(21) Appl. No.: 17/483,645

(22) Filed: Sep. 23, 2021

(65) Prior Publication Data

US 2023/0089354 A1    Mar. 23, 2023

(51) Int. Cl.
*H05K 7/20* (2006.01)
*F28F 9/02* (2006.01)

(52) U.S. Cl.
CPC ....... *H05K 7/20272* (2013.01); *F28F 9/0256* (2013.01); *H05K 7/20781* (2013.01)

(58) Field of Classification Search
None
See application file for complete search history.

(56) References Cited

U.S. PATENT DOCUMENTS

| | | | | |
|---|---|---|---|---|
| 10,905,031 B1 * | 1/2021 | Gao | ......... | G06F 1/184 |
| 11,547,022 B2 * | 1/2023 | Gao | ......... | H05K 7/20272 |
| 11,606,885 B2 * | 3/2023 | Gao | ......... | H05K 7/20781 |
| 11,711,908 B1 * | 7/2023 | Gao | ......... | H05K 7/20781 361/688 |
| 2021/0385978 A1 * | 12/2021 | Shao | ......... | H05K 7/1489 |
| 2022/0217872 A1 * | 7/2022 | Heydari | ......... | G06N 3/08 |
| 2022/0338388 A1 * | 10/2022 | Gao | ......... | H05K 7/20836 |
| 2022/0369510 A1 * | 11/2022 | Heydari | ......... | H05K 7/20836 |
| 2023/0007815 A1 * | 1/2023 | Heydari | ......... | H05K 7/20327 |
| 2023/0019501 A1 * | 1/2023 | Gao | ......... | H05K 7/20781 |
| 2023/0089909 A1 * | 3/2023 | Gao | ......... | H05K 7/20272 361/679.53 |

* cited by examiner

*Primary Examiner* — Courtney L Smith
(74) *Attorney, Agent, or Firm* — WOMBLE BOND DICKINSON (US) LLP

(57) ABSTRACT

According to one embodiment, a connector module, including a first bidirectional connector and a second bidirectional connector to fluidly interconnect between a cooling module of a server chassis and a rack manifold of an electronic rack; and a middle section positioned and connected between the first bidirectional connector and the second bidirectional connector. The middle section includes a side wall that separates the first bidirectional connector and the second bidirectional connector, and a side gate disposed on the side wall to place the first bidirectional connector and second bidirectional connector in fluid communication while in a first position and to fluidly isolate the first bidirectional connector from the second bidirectional connector while in a second position. The side gate is adapted to actuate to the first position when a fluid pressure differential between the first bidirectional connector and the second bidirectional connector exceeds a predetermined threshold.

11 Claims, 11 Drawing Sheets

MULTIPLE CHAMBERS CONNECTION MODULE FOR COOLING STREAMS

FIELD

Embodiments of the present disclosure relate generally to a connector for liquid cooling of electronics in data centers such as servers having processors and chips.

BACKGROUND

Information Technology (IT) includes technology such as computers that are accessible through the internet or a local network, which provide storage of, or access to, data, websites, computer programs, algorithms, services, and more. IT equipment such as servers and other electronic devices (e.g., peripheral devices) can be installed in a chassis. These chassis can then be installed in an IT rack. An IT rack can be populated with a number of chassis, each housing IT equipment, as a manner of managing power and thermal requirements of the IT equipment.

Thermal management for a data center that includes several active electronic racks is critical to ensure proper performance of servers and other IT equipment (e.g., performing IT services) that is operating in the racks. Without proper thermal management, however, the thermal environment (e.g., temperature) within the racks may exceed thermal operational thresholds, which may result in adverse consequences (e.g., servers failing, etc.). One way to manage the thermal environment is the use of cooling air to cool the IT equipment. The cooling air is recirculated through cooling units. Heat generated by the IT equipment is captured by the cooling air and is extracted by the cooling unit. There are many existing air cooling solutions for data centers with a primary function to supply cooling air to a room, remove hot air from the room, and process the hot air back to the cooling air.

Reliability can ensure system uptime to prevent production losses under certain conditions. Redundancy can be employed in liquid cooling system to maintain reliability. For example, liquid cooling redundant design can minimize system failure compared when only a single port is used. In some cases, interface design (e.g., connectors) enables redundant fluid streams, thereby avoiding any downtime due to component and/or system failure.

A liquid cooling system transfers and delivers liquid between an IT rack and the chassis, and between the chassis and the IT equipment that is mounted on the chassis. Such a system can provide high operational and cooling efficiency of the IT equipment. Liquid cooling for high power density electronics has increased in popularity because air cooling can be thermally insufficient in some circumstances. Liquid cooling allows for higher packaging density and increased computing load of electronics, by transferring greater thermal energy from the electronic equipment.

BRIEF DESCRIPTION OF THE DRAWINGS

The aspects are illustrated by way of example and not by way of limitation in the figures of the accompanying drawings in which like references indicate similar elements. It should be noted that references to "an" or "one" aspect of this disclosure are not necessarily to the same aspect, and they mean at least one. Also, in the interest of conciseness and reducing the total number of figures, a given figure may be used to illustrate the features of more than one aspect, and not all elements in the figure may be required for a given aspect.

DETAILED DESCRIPTION

Figure 1:
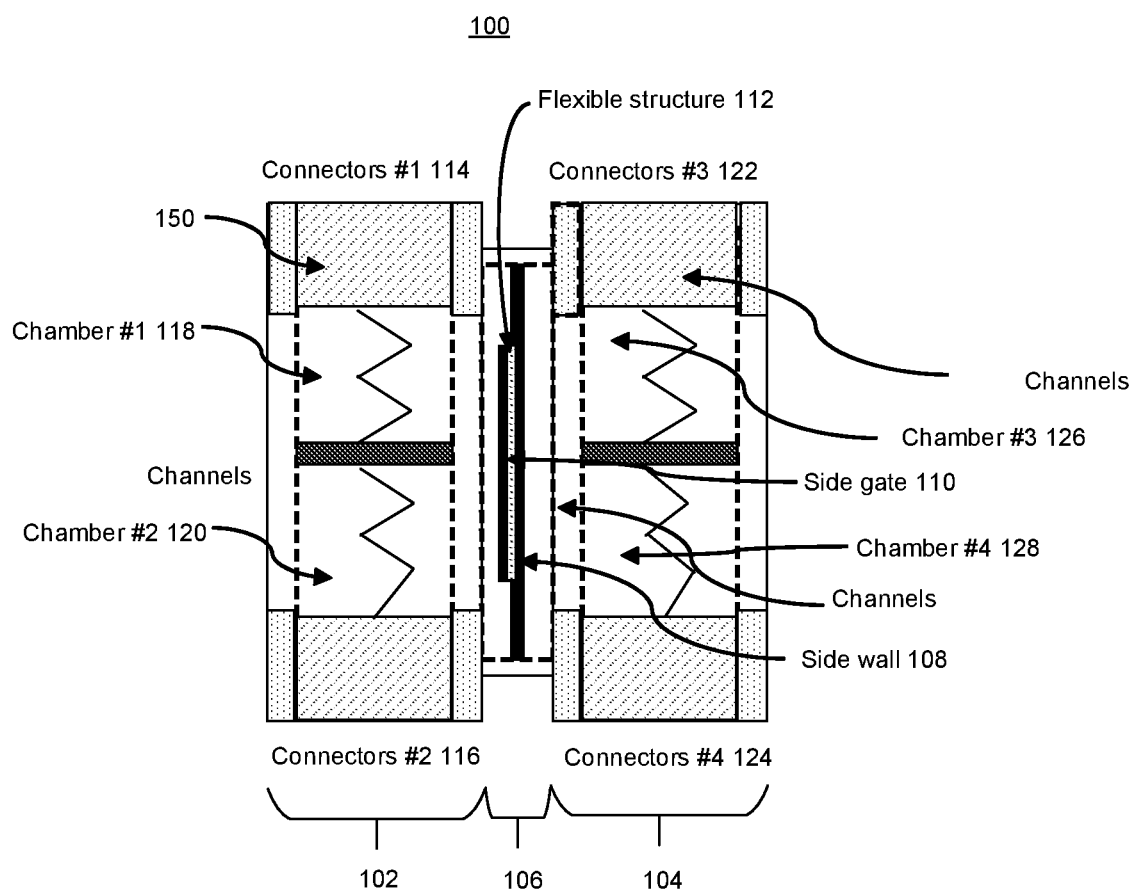
FIG. 1 is a schematic diagram illustrating a top view of an example of a connector module according to one embodiment.

Several aspects of the disclosure with reference to the appended drawings are now explained. Whenever the shapes, relative positions and other aspects of the parts described in a given aspect are not explicitly defined, the scope of the disclosure here is not limited only to the parts shown, which are meant merely for the purpose of illustration. Also, while numerous details are set forth, it is understood that some aspects may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

Disclosed embodiments provide a connector module for a server chassis and rack manifold with liquid cooling. Rack fluid distribution system may be equipped with different fluid distribution systems, for different cooling requirements including redundant requirements. In addition, the rack manifold may include one or more supply lines and one or more return lines in different use cases. This may increase the difficulty for implementing different liquid cooled server configurations on the rack manifold. The server liquid interfaces may need to match with the ones on the racks. Various disclosed embodiments described herein provide connector module which may be used for adapting different server systems to different rack fluid distribution hardware design. In addition, the connector module may enable advanced feature for enabling redundant design and operation.

A flexible connector module may be needed because different type of servers may require different fluid systems to function. In addition, the rack configurations may be different for different IT equipment and systems. The individual server may have different cooling modules designed and implemented for it, including the liquid cooling module connectors. In addition, the difference in the fluid flowing direction may need to be considered. The connector module for a liquid cooling system design lack a consideration for limited space. The conventional solutions for fluid connectors are either manual mating or blind mating and designed for one single fluid stream.

The new hardware is needed for the continuously increasing diversity of the system design and use cases. Therefore, it is a requirement in the modern hardware design to have high interoperability and reliability to accommodate different use cases.

The present disclosure solves the problems described above by providing a connector module for the liquid cooling system. Specifically, the disclosed embodiments in the present disclosure describe a connector module which includes four connectors. Each of the connectors are either manual mating or blind mating types. The connectors are disposed on both ends of the connector module. The connector module has a first and second bidirectional connector connected by a middle section having a fluid channel, a side wall, and a side gate. The side gate is attached to the side wall through a flexible structure. The side wall includes an opening which is covered by the side gate when the gate is in a close position. The side gate only opens from one side and when the fluid pressure differential between the bidirectional connector and the second bidirectional connector exceeds a predetermined threshold. Each of the first and second bidirectional connectors includes two chambers therein. The middle section controls the fluid streams flowing among the chambers in various manners.

Disclosed embodiments use the same set of connectors for different use cases, including parallel supply and return, retardant supply and return, and supply and return. In addition, disclosed embodiments solve a problem which involves a single failure port from the rack distribution system. The disclosed embodiments of a connector module described herein can be used for enabling a full redundant operation on the rack liquid cooling system. A system, as discussed above, in accordance with embodiments may provide a hardware design used for operating different fluid streams and the fluid streams can be operated automatically from different fluid ports under different scenarios.

According to one aspect, a connector module includes a first bidirectional connector to fluidly interconnect between a server chassis and a rack manifold of an electronic rack, a second bidirectional connector to fluidly interconnect between the server chassis and the rack manifold of the electronic rack, and a middle section positioned and connected between the first bidirectional connector and the second bidirectional connector. The middle section includes a side wall that separates the first bidirectional connector and the second bidirectional connector, and a side gate disposed on the side wall to place the first bidirectional connector and second bidirectional connector in fluid communication while in a first position and to fluidly isolate the first bidirectional connector from the second bidirectional connector while in a second position. The side gate is adapted to actuate to the first position when a fluid pressure differential between the first bidirectional connector and the second bidirectional connector exceeds a predetermined threshold and to actuate to the second position when the fluid pressure differential is below the predetermined threshold.

In one embodiment, the side wall includes an opening covered by the side gate when the side gate is in the second position, thereby fluidly isolating the first bidirectional connector from the second bidirectional connector. When the side gate is in the first position, the fluid streams flowing from high pressure side to the low pressure side. In one embodiment, the side gate is in the second position when the fluid pressure differential between the first bidirectional connector and the second bidirectional connector equals to zero.

In one embodiment, the first bidirectional connector includes a first connector, a second connector, a first chamber, and a second chamber. The second bidirectional connector includes a third connector, a fourth connector, a third chamber, and a fourth chamber. In one embodiment, the first and second bidirectional connectors include spring-actuated stoppers coupled to the first connector, the second connector, the third connector, and the fourth connector. The spring-actuated stoppers seal the first bidirectional connector and the second bidirectional connector while in a third position (e.g., in a released state).

In one embodiment, the spring-actuated stoppers create a fluid path within the first bidirectional connector and the second bidirectional connector while the spring-actuated stoppers are in a fourth position (e.g., in a compressed state). In one embodiment, the middle section includes a flexible structure enabling the side gate to cover the opening when the side gate is in the second position. In one embodiment, an opening pressure of the side gate is controlled based on an elasticity factor of a torsion spring positioned with the flexible structure.

According to another aspect, the above connector module can be implemented in a server chassis of an electronic rack of a data center. The server chassis includes one or more servers, each server having one or more electronic devices such as processors; and cooling assemblies. Each cooling assembly corresponds to one of the one or more servers. Each of the cooling assemblies includes a cooling module positioned on top of the one or more processors and configured to provide liquid cooling to the electronic devices of a corresponding server; and the above described connector modules.

In one embodiment, the cooling assembly further includes supply lines extended from a rack fluid unit (e.g., a rack manifold) to supply the cooling liquid to the cooling module to extract heat generated from the one or more processors of the server; and return lines coupled to the cooling module to return the cooling liquid carrying the heat back to the rack fluid unit.

In one embodiment, the supply lines include a main supply line and a backup supply line. The first bidirectional connector is connected to the main supply line. The second bidirectional connector is connected to the backup supply line. The first connector is closed sealing the first bidirectional connector from the main supply line. The fourth connector is closed sealing the second bidirectional connector from the cooling module. The second connector is open to fluidly connect the first bidirectional connector to the cooling module. The third connector is open to fluidly connect the second bidirectional connector to the backup supply. The side gate to be in the first position, thereby delivering the cooling fluid from the backup supply line to the cooling module via the first bidirectional connector when the main supply line is sealed from the rack fluid unit.

In one embodiment, the return lines include a main return line and a backup return line. The first bidirectional connector is connected to the backup return line. The second bidirectional connector is connected to the main return line. The first connector is closed sealing the first bidirectional connector from the cooling module. The fourth connector is closed sealing the second bidirectional connector from the main return line. The second connector is open to fluidly connect the first bidirectional connector to the backup return line. The third connector is open to fluidly connect the second bidirectional connector to the cooling module. The side gate to be in the first position, thereby returning the cooling liquid carrying the heat back from the cooling module to the rack fluid unit via the backup return line when the main return line is disconnected from the second bidirectional connector.

In one embodiment, a blocked main return line becomes unblocked, the fourth connector is configured to open to fluidly connect the second bidirectional connector to the main return line, the side gate configured to move to the second position to seal the second bidirectional connector from the first bidirectional connector, thereby returning the cooling liquid carrying the heat back from the cooling module to the rack fluid unit via the second bidirectional connector and the main return line.

In one embodiment, a first set of the connector modules is connected to the supply lines. A second set of the connector modules is connected to the return lines. In one embodiment, the first bidirectional connector of the first set of the connector modules is connected to the cooling module. The second bidirectional connector of the second set of the connector modules is connected to the cooling module. In one embodiment, the first bidirectional connector and the second bidirectional connector of the first set of the connector modules are connected to the cooling module while the side gate is in the second position, thereby delivering the cooling fluid from the supply lines to the cooling module via the first bidirectional connector and the second bidirectional connector of the first set of the connector modules.

In one embodiment, the first bidirectional connector and the second bidirectional connector of the second set of the connector modules are connected to the cooling module while the side gate is in the second position, thereby returning the cooling liquid carrying the heat back from the cooling module to the rack fluid unit via the first bidirectional connector and the second bidirectional connector of the second set of the connector modules.

In one embodiment, the first bidirectional connector of the connector modules is connected to one of the supply lines. The second bidirectional connector of the connector modules is connected to one of the return lines, the first bidirectional connector and the second bidirectional connector are connected to the cooling module while the side gate is in the second position and the spring-actuated stoppers are in the fourth position, thereby circulating the cooling fluid from one of the supply lines to one of the return lines.

According to a further aspect, an electronic device includes a rank manifold and a stack of server chassis. Each server chassis may represent any of the server chassis described above.

FIG. 1 is a block diagram illustrating a cross sectional view of an example of a connector module 100 according to one embodiment. The connector module 100 is a part of a cooling assembly for cooling a computing component positioned on a circuit board such as a printed circuit board (PCB). The cooling assembly may also include a cooling plate to be attached to an electronic device.

Referring to FIG. 1, the connector module 100, for example, includes a first bidirectional connector 102 to fluidly interconnect between a server chassis (not shown) and a rack manifold (not shown) of an electronic rack, a second bidirectional connector 104 to fluidly interconnect between the server chassis and the rack manifold of the electronic rack, and a middle section 106 positioned and connected between the first bidirectional connector 102 and the second bidirectional connector 104. Bidirectional means that the fluid may flow in either direction within each connector.

The middle section 106 may include a side wall 108 that separates the first bidirectional 102 connector and the second bidirectional connector 104, and a side gate 110 disposed on the side wall 108 to place the first bidirectional connector 102 and second bidirectional connector 104 in fluid communication while in a first position and to fluidly isolate the first bidirectional connector 102 from the second bidirectional connector 104 while in a second position. The side gate 110 is adapted to actuate to the first position when a fluid pressure differential between the first bidirectional connector 102 and the second bidirectional connector 104 exceeds a predetermined threshold and to actuate to the second position when the fluid pressure differential is below the predetermined threshold. The side gate 110 may only open in one direction when the fluid pressure differential between the first bidirectional connector 102 and the second bidirectional connector 104 exceeds the predetermined threshold.

Still referring to FIG. 1, each of the first bidirectional connector 102 and the second bidirectional connector 104 may have two end connectors. The first bidirectional connector 102 includes two end connectors (e.g., connector #1 114 and connector #2 116). These two end connectors as well as the entire connector module enable dripless design. There are two fluid chambers within the first bidirectional connector 102 (e.g., chamber #1 118 and chamber #2 120). Similarly, the second bidirectional connector 104 includes two end connectors (e.g., connector #3 122 and connector #4 124). There are two fluid chambers within the second bidirectional connector 104 (e.g., chamber #3 126 and chamber #4 128). The middle section 106 connects the first bidirectional connector 102 and the second bidirectional connector 104. The middle section 106 is configured for the fluid channel. The fluid channel is blocked by the side wall 108 and the side gate 110. The side gate 110 is connected to the side wall 108 through a flexible structure 112. The side gate 110 is configured to only open and allow the fluid to flow from one side of the connector module to the other side of the connector module. For example, the side gate 110 allows the fluid flow from the second bidirectional connector 104 to the first bidirectional connector 102 when the side gate 110 is open.

In this example, when the fluid pressure within the second bidirectional connector 104 is higher than fluid pressure within the first bidirectional connector 102, the side gate 110 is adapted to actuate to the first position (open). Thereafter, the cooling fluid can flow from the second bidirectional connector 104 to the first bidirectional connector 102. The side gate 110 can be in the first position (open) and the second position (close) based on the fluid pressure differential between the first bidirectional connector 102 and the second bidirectional connector 104. That is, the status of the side gate 110 is based on the fluid pressure within the first bidirectional connector 102 and the second bidirectional connector 104.

In one embodiment, the first bidirectional connector 102 includes a first connector 114, a second connector 116, a first chamber 118, and a second chamber 120. The second bidirectional connector 104 includes a third connector 122, a fourth connector 124, a third chamber 126, and a fourth chamber 128.

In another embodiment, the first connector 114 and the third connector 122 can be configured to connect to pipes or hoses. Similarly, the second connector 116 and the fourth connector 124 can be configured to connect to pipes or hoses.

In one embodiment, the first 102 and second bidirectional connectors104 further include spring-actuated stoppers 150 coupled to the first connector 114, the second connector 116, the third connector 122, and the fourth connector 124. The spring-actuated stoppers 150 seal the first bidirectional connector 102 and the second bidirectional connector 104 while in a third position (e.g., released). The third position refers to when the spring-actuated stoppers 150 seal all the connectors as illustrated in FIG. 1.

The middle section 106 further includes a flexible structure 112 enabling the side gate 110 to cover the opening when the side gate 110 is in the second position. An opening pressure of the side gate 110 is controlled based on an elasticity factor of a torsion spring positioned with the flexible structure 112. The side gate 110 may be configured to substantially seal the opening in order to block the cooling fluid.

In one embodiment, for example, the side wall 108 includes an opening covered by the side gate 110 when the side gate 110 is in the second position (close), thereby fluidly isolating the first bidirectional connector 102 from the second bidirectional connector 104. When the side gate 110 is in the first position (open), the fluid streams flow from the high pressure side of the connector module to the low pressure side of the connector module. For example, when the fluid pressure within the second bidirectional connector 104 is higher than the first bidirectional connector 102, the side gate 110 is open, thereby allowing the cooling fluid flows from the second bidirectional connector 104 to the first bidirectional connector 102 via the side gate 110.

In one embodiment, the side gate 110 is in the second position when the fluid pressure differential between the first bidirectional connector 102 and the second bidirectional connector 104 equals to zero.

The flexible structure 112 enables the side gate 110 to substantially cover an opening disposed on the side wall 108. When the side gate 110 covers the opening, the fluid channel is closed. That means the fluid chambers #3 126 and #4 128 are segregated from the fluid chambers #1 118 and #2 120. When the fluid pressure within the second bidirectional connector 104 is higher than the first bidirectional connector 102, the fluid pressure differential causes the side gate 110 to open and to connect fluid channels. Consequently, the fluid chambers within the second bidirectional connector 104 and the first bidirectional connector 102 are connected.

In one embodiment, the connectors may be dripless connectors. In another embodiment, the two of the connectors, such as the connector #1 114 and the connector #3 122 are configured with a barb connection structure and the connector #2 116 and the connector #4 124 are dripless connectors. Described embodiments may include the middle section 106.

Figure 2:
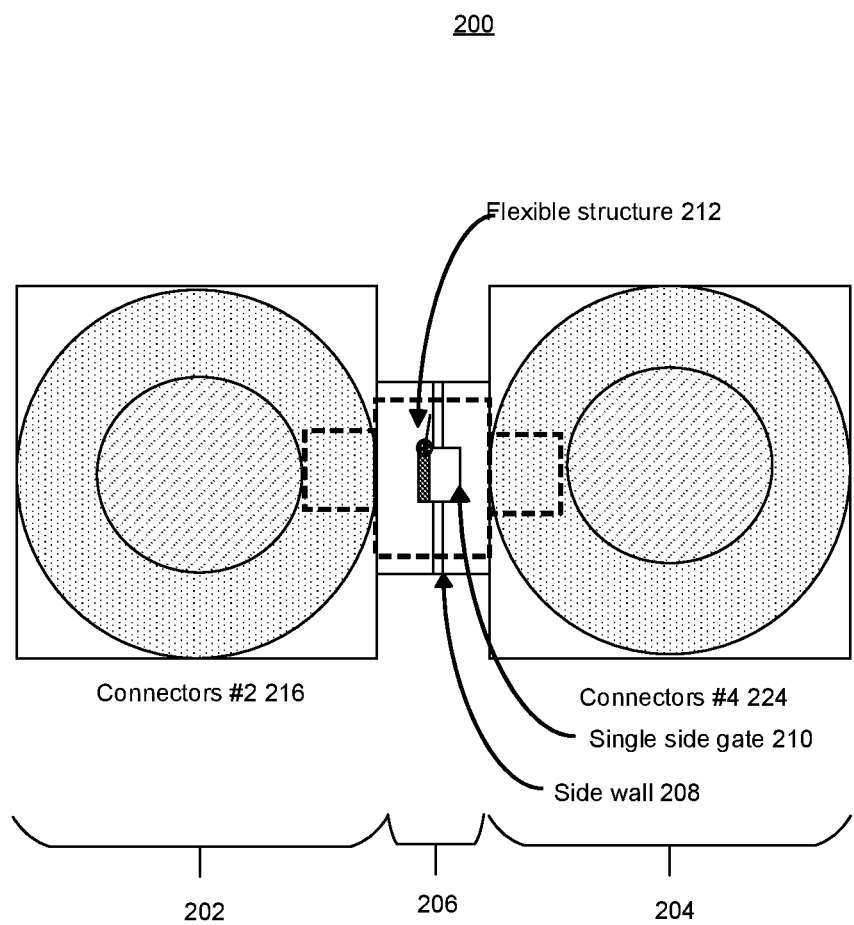
FIG. 2 is a schematic diagram illustrating an end view of an example of a connector module according to one embodiment.

FIG. 2 is an end view of a connector module according to one embodiment. Referring to FIG. 2, FIG. 2 shows a cross section of a first bidirectional connector 202, a middle section 206, and a second bidirectional connector 204. FIG. 2 also shows the end view of the side wall 208 and the single side gate 210. The end view shows a cross section of the connectors #2 216 and connectors #4 224. As shown, the side gate 210 is attached to the side wall 208 and connected through the flexible structure 212. In one embodiment, different elasticity factors based a torsion spring in the flexible structure 212 define the opening pressure of the side gate 210. Once the pressure decreases to the predefined value, the side gate 210 returns to the close position. In one example, the larger the pressure, the higher the flow rate.

According to another embodiment, the above connector module, for example connector module 200, can be implemented in an electronic rack of a data center. The electronic rack data center includes one or more servers, each server having one or more processors; and cooling assemblies. Each cooling assembly corresponds to one of the one or more servers. Each of the cooling assemblies includes a cooling module positioned on top of the one or more processors and configured to provide liquid cooling to the one or more processors of a corresponding server; and the above described connector modules.

In one embodiment, the cooling assembly further includes supply lines extended from a rack fluid unit to supply the cooling liquid to the cooling module to exchange heat generated from the one or more processors of the server; and return lines coupled to the cooling module to return the cooling liquid carrying the heat back to the rack fluid unit.

In one embodiment, the first bidirectional connector 202 is connected to a first supply line of the supply lines and the second bidirectional connector is connected to a second supply line of the return lines. A fluid pressure in each of the first supply line and the second supply line is substantially the same, and the side gate 210 is in the second position and the spring-actuated stoppers are in the fourth position (e.g., compressed).

Figure 3:
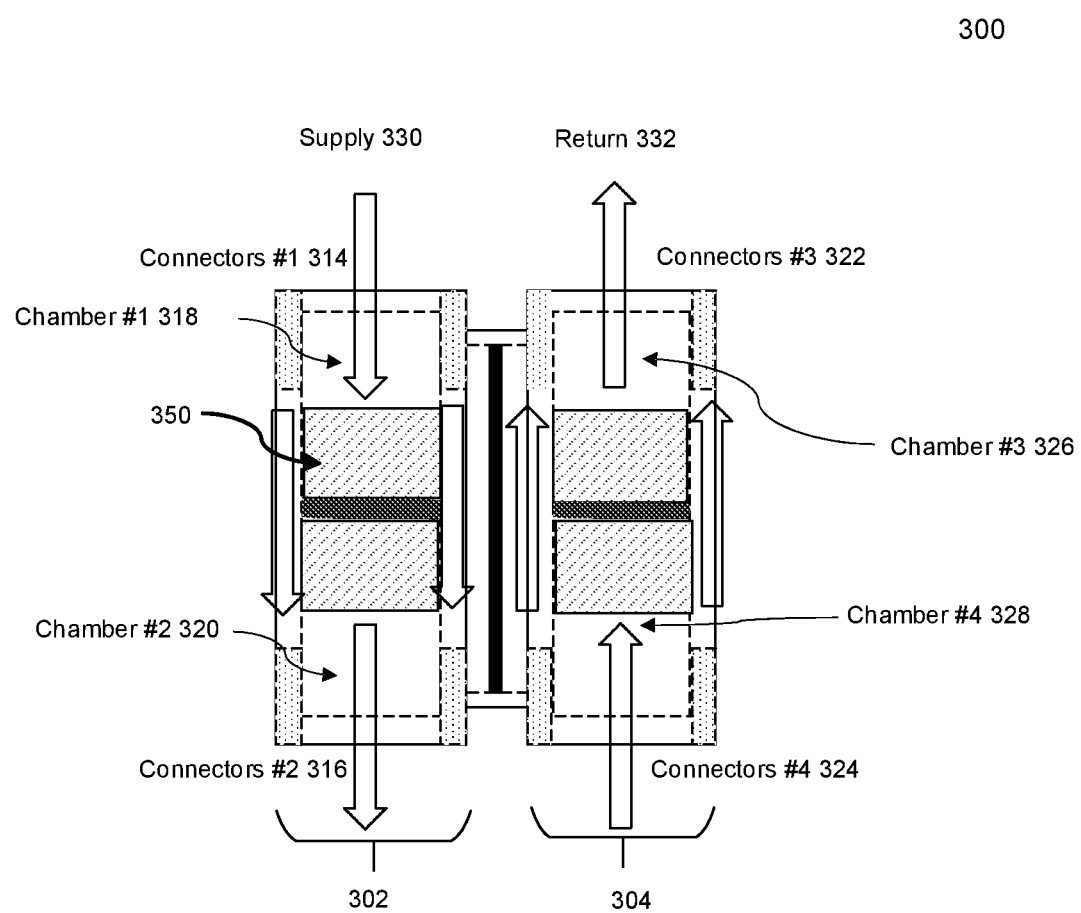
FIG. 3 is a schematic diagram illustrating a top view of an example of a connector module connected to supply and return lines according to one embodiment.

FIG. 3 is schematic illustrating a top view of an example of a connector module 300 connected to supply and return lines according to one embodiment. The described embodiment of the connector module 300 can be used for a full recirculation loop. The fluid pressure within the second bidirectional connector 304 connected to the return line 332 is lower than the fluid pressure within the first bidirectional connector 302 connected to the supply line 330. Therefore, the single gate is in a close position and it is not shown in FIG. 3. In this example, the connector module 300 can be either pre-integrated to the server chassis or pre-integrated to the rack manifold. It is noted that the detail of the side gate structure is not shown in FIG. 3.

As illustrated in FIG. 3, the spring-actuated stoppers 350 create a fluid path within the first bidirectional connector 302 and the second bidirectional connector 304 while the spring-actuated stoppers 350 are in a fourth position (e.g., in a compressed position). In the fourth position, the spring-actuated stoppers 350 move toward the middle of the first bidirectional connector 302 and the second bidirectional connector 304 to unblock the chambers 318, 320, 322, 328 and unseal the connectors 314, 316, 322, 324. In this example, as illustrated by the arrows, the cooling fluid supplied by a supply line 330 flows from chamber #1 318 to chamber #2 320. Similarly, as illustrated by the arrows, the cooling fluid flows from chamber #4 424 to chamber #3 426 and to the return line 332.

Figure 4:
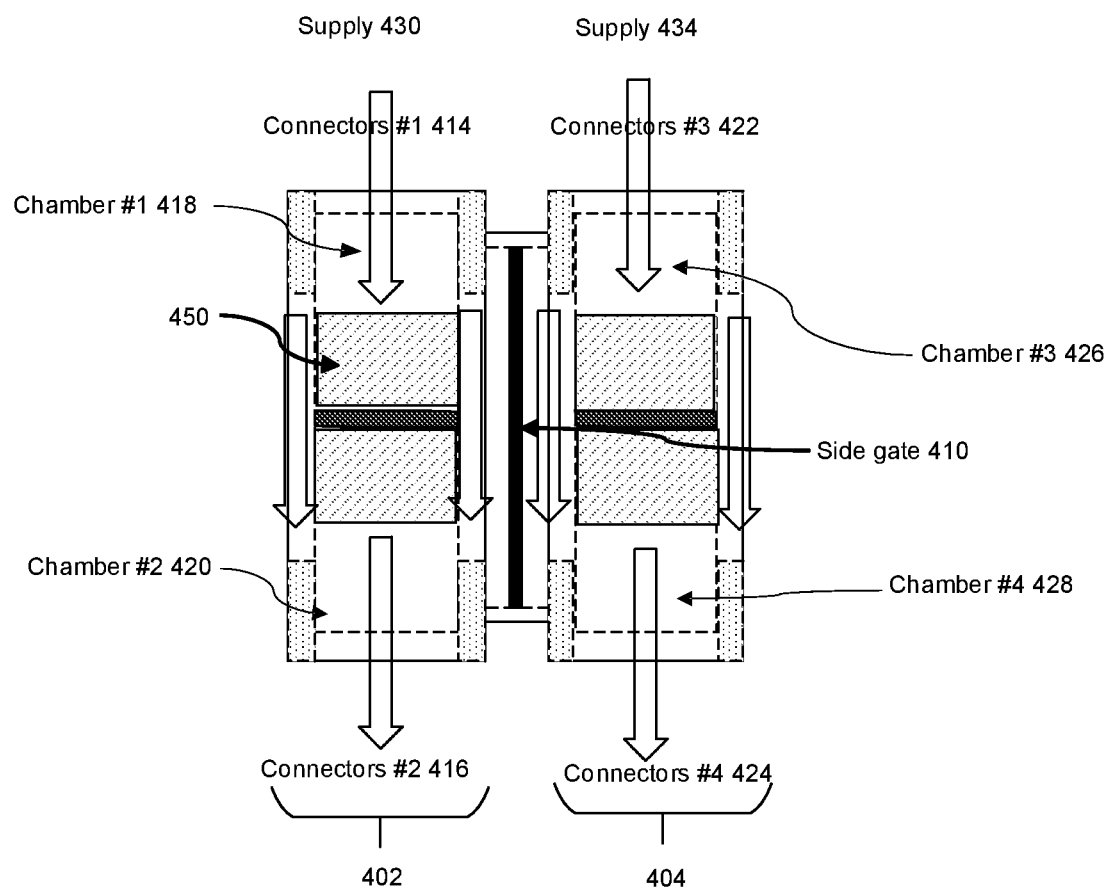
FIG. 4 is a schematic diagram illustrating a top view of an example of a connector module connected to supply lines according to one embodiment.

FIG. 4 is a schematic illustrating a top view of an example connector module connected to two parallel supply lines according to one embodiment. Referring to FIG. 4, the connectors #1 414 and #3 422 are configured for connecting the connector module 400 with a rack manifold of the electronic rack and the connectors #2 420 and connectors #4 428 are configured for connecting the connector module 400 with a server chassis. The first bidirectional connector 402 and the second bidirectional connector 404 may be understood as redundant loops for a cooling module within the server, or can be two inlet loops for different cooling modules within one server.

In one embodiment, the first bidirectional connector 402 is connected to a first supply line of the supply lines and the second bidirectional connector 404 is connected to a second supply line of the return lines. A fluid pressure in each of the first and the second supply lines is substantially the same. The side gate 410 is in the second position and the spring-actuated stoppers 450 are in the fourth position.

As shown in FIG. 4, both first 414 and second 422 connectors are connected to supply lines 430, and 434, respectively. That means, the fluid pressure differential between the first bidirectional connector 402 and the second bidirectional connector 404 equals to zero. Therefore, the side gate 410 is in a second (close) position. In this example, as illustrated by the arrows, the cooling fluid supplied by both supply lines 430, 433 flows from chamber #1 418 to chamber #2 420, and from chamber #3 426 to chamber #4 428.

The first connector 414 and third connector 422 are connected to the rack fluid unit. The second 416 and fourth 424 connectors are connected to the cooling module. The first bidirectional connector 402 and the second bidirectional connector 404 are connected to the supply lines while the side gate 410 is in the second position and the spring-actuated stoppers are in the fourth position.

Figure 5:
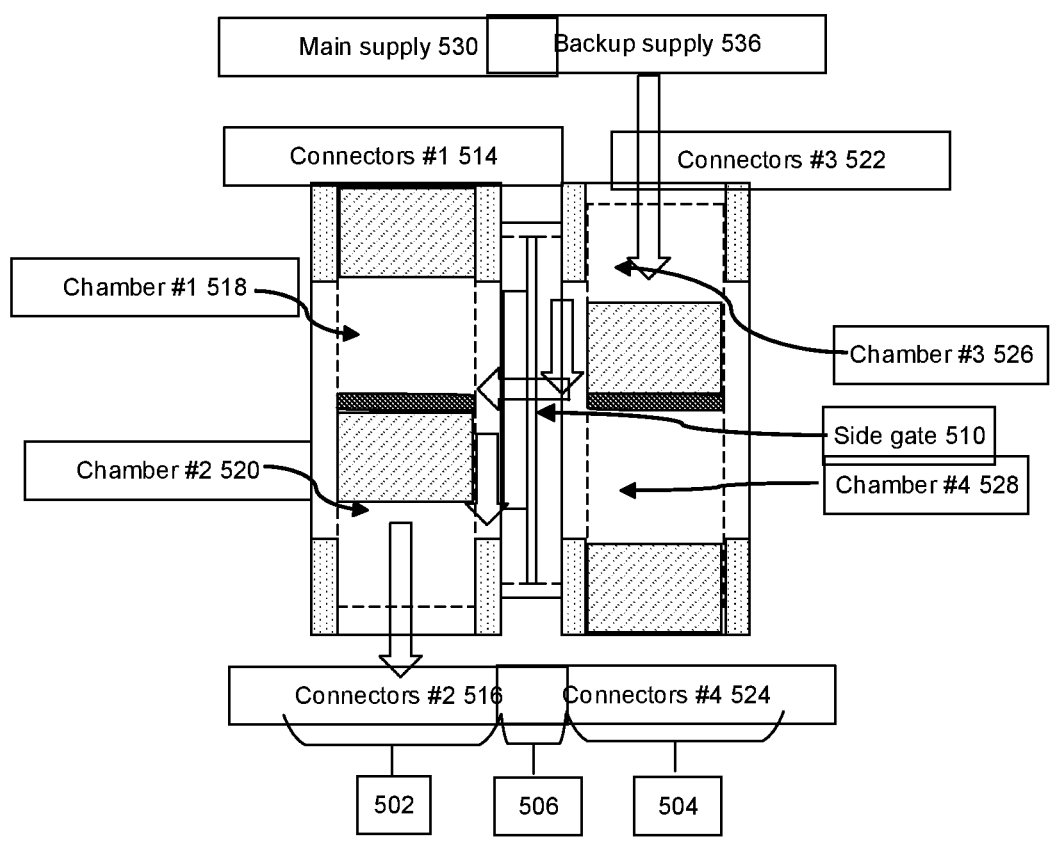
FIG. 5 is a schematic diagram illustrating a top view of an example of a connector module connected to a main supply line and a backup supply line according to one embodiment.

FIG. 5 is a schematic illustrating a top view of an example of a connector module connected to a main supply line and a backup supply line according to one embodiment.

Referring to FIG. 5, the supply lines include a main supply line 530 and a backup supply line 536. The first bidirectional connector 502 is connected to the main supply line 530. The second bidirectional connector 504 is connected to the backup supply line 536. The first connector 514 is closed sealing the first bidirectional connector 502 from the main supply line 530. As shown, the first connector 514 is sealed by the spring-actuated stopper. The fourth connector 524 is closed sealing the second bidirectional connector 504 from the cooling module. The fourth connector 524 is sealed by the spring-actuated stopper. The second connector 516 is open to fluidly connect the first bidirectional connector 502 to the cooling module. The third connector 522 is open to fluidly connect the second bidirectional connector 504 to the backup supply 536. The side gate 510 to be in the first position, thereby delivering the cooling fluid from the backup supply line 536 to the cooling module via the first bidirectional connector 502 when the main supply line 530 is sealed from the rack fluid unit.

As shown, the connector #1 514 and connector #3 522 are configured for connecting with the two sets of rack liquid supply systems. However, there is one side connecting with the server chassis as connectors #2 as shown in FIG. 5. The main supply line 530 generates the streams from connectors #1 to connectors #2. When the main supply line is not functioning, the backup supply line picks up by opening the side gate 510. Once the side gate 510 is open, the fluid from the backup supply line 536 can be supplied from the chamber #3 526 to chamber #2 520. Since the connector #1 514 is close, the cooling fluid does not flow within chamber #1 514. In this example, connector #4 528 is configured to be closed. During the normal operation, the cooling fluid from the main supply line 530 flows from chamber #1 518 to chamber #2 520. Since the fluid main supply line 530 is working, then the side gate 510 is not open and the chamber #3 526 is sealed and no cooling fluid flowing within chamber #3 526. As shown in FIG. 5, the side gate 510 is in a first position (open). In this example, the connector module 500 enables to equip the single input and output cooling module based servers with full rack level fluid system redundancy. In an embodiment, the connector #4 524 may not be in use.

In this example, as illustrated by the arrows, the cooling fluid supplied by a backup supply line 536 flows from chamber #3 526 to chamber #2 520 via the middle section 506.

Figure 6:
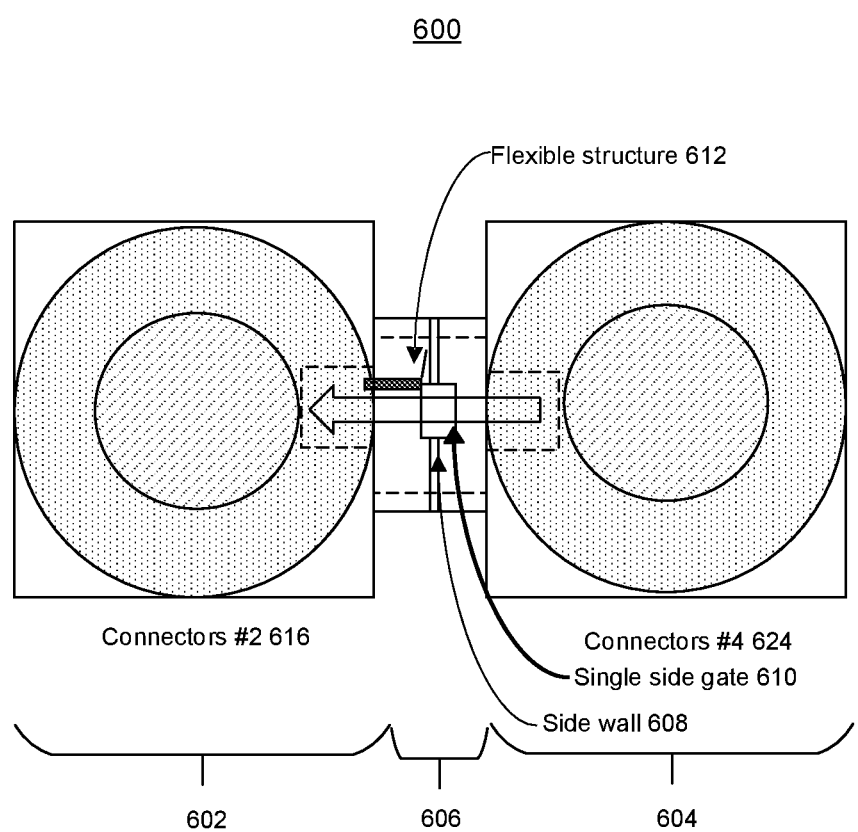
FIG. 6 is a schematic diagram illustrating an end view of an example of a connector module connected to a main supply line and a backup supply line according to one embodiment.

FIG. 6 is schematic illustrating the end view of the connector module 600. The end view shows a cross section of the connector #2 616 and connector #4 624. As shown, the fluid flows from one side of the bidirectional connector to the other side of the bidirectional connector according to one embodiment. For example, the arrow shows the fluid flows from the second bidirectional connector 604 to the first bidirectional connector 602 via the middle section 606. The middle section 606 positioned and connected between the first bidirectional connector 602 and the second bidirectional connector 604. The middle section 606 includes a side wall 608 that separates the first bidirectional connector 602 and the second bidirectional connector 604, and a side gate 610 disposed on the side wall 608 to place the first bidirectional connector 602 and second bidirectional connector 604 in fluid communication while in a first position and to fluidly isolate the first bidirectional connector 602 from the second bidirectional connector 604 while in a second position. The side gate 610 is connected to the side wall 608 through a flexible structure 612. The single side gate 610 on the side wall 608 is open since the pressure from the backup supply line fluid is higher than the pressure from the main supply line. This can be understood as that the separate chambers within the first bidirectional connector 602 and second bidirectional connector 604 are connected and the connectors are connected to a supply line.

Figure 7:
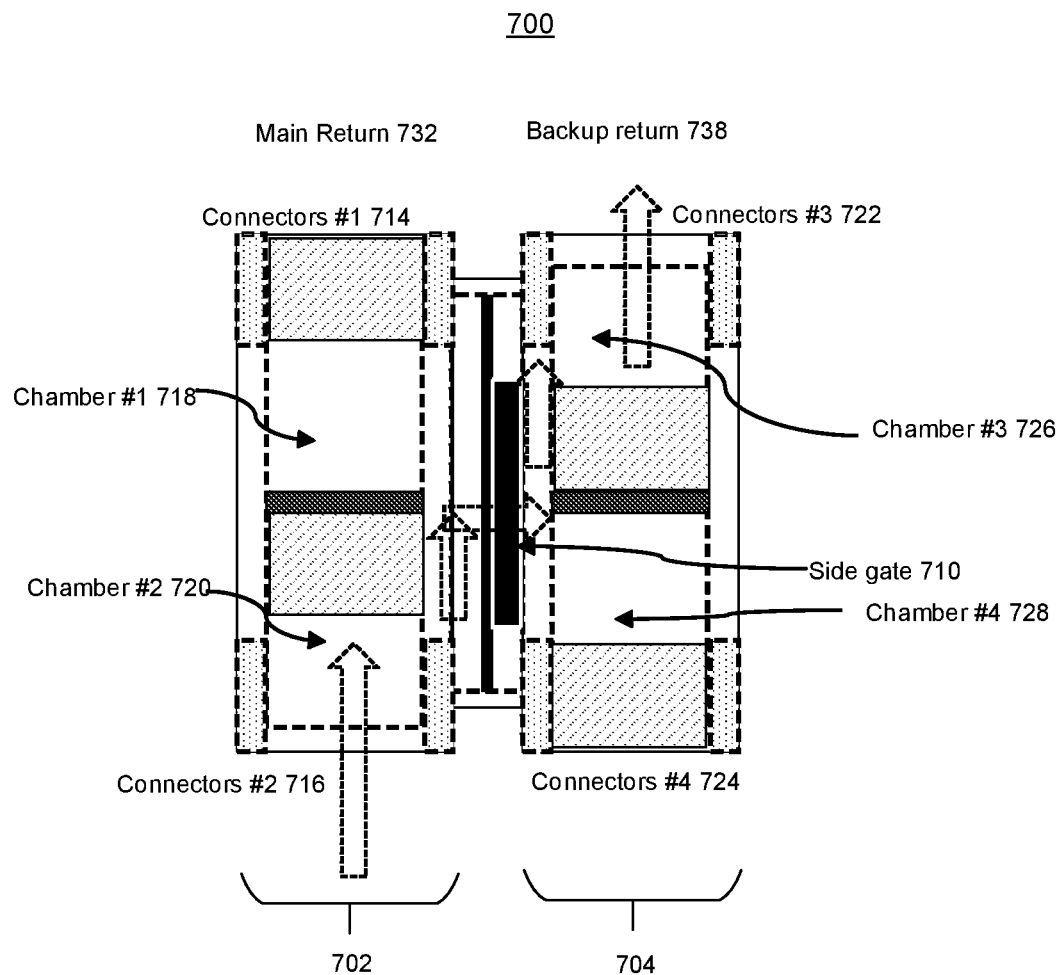
FIG. 7 is schematic diagram illustrating a top view of an example of a connector module connected to a main return line and a backup return line according to one embodiment.

FIG. 7 is schematic illustrating a top view of an example of a connector module 700 connected to a main return line and a backup return line according to one embodiment.

Referring to FIG. 7, the return lines include a main return line 732 and a backup return line 738. As shown, the first bidirectional connector 702 is connected to the backup return line 738. The second bidirectional connector 704 is connected to the main return line 732. The first connector 714 is closed sealing the first bidirectional connector 702 from the cooling module. The first connector 714 is sealed by the spring-actuated stopper. The fourth connector 724 is closed sealing the second bidirectional connector 704 from the main return line 732. As shown, the fourth connector 724 is sealed by the spring-actuated stopper. The second connector is open to fluidly connect the first bidirectional connector 702 to the backup return line 738. The third connector is open to fluidly connect the second bidirectional connector 704 to the cooling module. The side gate 710 to be in the first position, thereby returning the cooling liquid carrying the heat back from the cooling module to the rack fluid unit via the backup return line 738 when the main return line 732 is disconnected from the second bidirectional connector 704.

In one embodiment, for example, when a blocked main return line 732 becomes unblocked, the fourth connector is configured to open to fluidly connect the second bidirectional connector 704 to the main return line 732. The side gate 710 is configured to move to the second position to seal the second bidirectional connector 704 from the first bidirectional connector 702, thereby returning the cooling liquid carrying the heat back from the cooling module to the rack fluid unit via the second bidirectional connector 704 and the main return line 732.

Still referring to FIG. 7, the first bidirectional connector 702 is configured to be connected to the main return line and the second bidirectional connector 704 is configured to be connected to the backup return line. As illustrated, the connector #3 722 is open and connector #1 714 is close. Since connector #1 is closed, the fluid pressure within chamber #2 720 increases and the side gate 710 is actuated and the fluid flows from chamber #3 726 to chamber #2 720. Once the main return line 732 is restored, the connector #3 722 is connected and then the side gate is closed and chamber #2 is not connected to the chamber #3 even the connector #2 716 is open.

Figure 8:
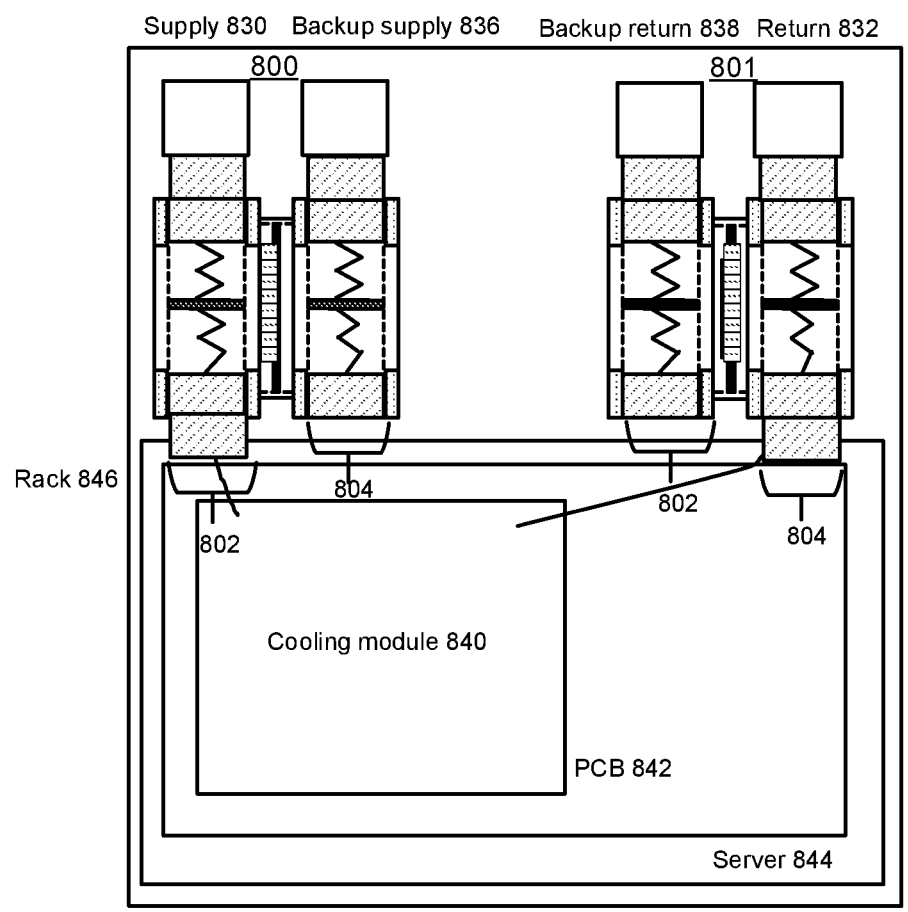
FIG. 8 is a schematic diagram illustrating a top view of an example of connector modules connected to a cooling module and a single supply line and a single return line according to one embodiment.

FIG. 8 is schematic illustrating a top view of an example of connector modules connected to a cooling module and a single supply line and a single return line according to one embodiment. Referring to FIG. 8, a first set of connector modules 800 is connected to supply lines. A second set of connector modules 801 is connected to return lines.

In one embodiment, the first bidirectional connector 802 of the first set of connector modules 800 is connected to the cooling module 840. The second bidirectional connector 804 of the second set of connector modules 801 is connected to the cooling module 840. Cooling module 840 may perform heat removal from the printed circuit board (PCB) 842 by functioning as a heat sink. It should be noted that the cooling module 840 is connected to one supply line 830 and one return line 832. The connector modules are used between the server chassis 844 and the rack manifold 846. The rack manifold 846 is equipped with two sets of supply (a supply 830 and a backup supply 836) and two sets of return (a return 832 and a backup return 838). That is, the rack manifold 846 includes a full redundant fluid system. The connector modules 800, 801 are configured to connect to two rack supply systems and two rack return systems. The other end of the connector modules 800, 801 are configured to connect to the cooling module 840 with one connector. Described embodiments provide the server 844 with a full rack level fluid distribution redundant. It will be appreciated that this described embodiment enables the cooling module 840 attached on the PCB 842 a full rack level or module level end to end redundancy, without adding additional port and loop on the cooling module 840. Note that the first set of connector modules 800 can be understood to represent the connector module 500 in FIG. 5. Similarly, the second set of connector modules 801 can represent the connector module 700 in FIG. 7. In the example shown in FIG. 8, the second bidirectional connector 804 of the first set of connector modules 800 and the second bidirectional connector 802 of the second set of connector modules 801 are not used (closed).

Figure 9:
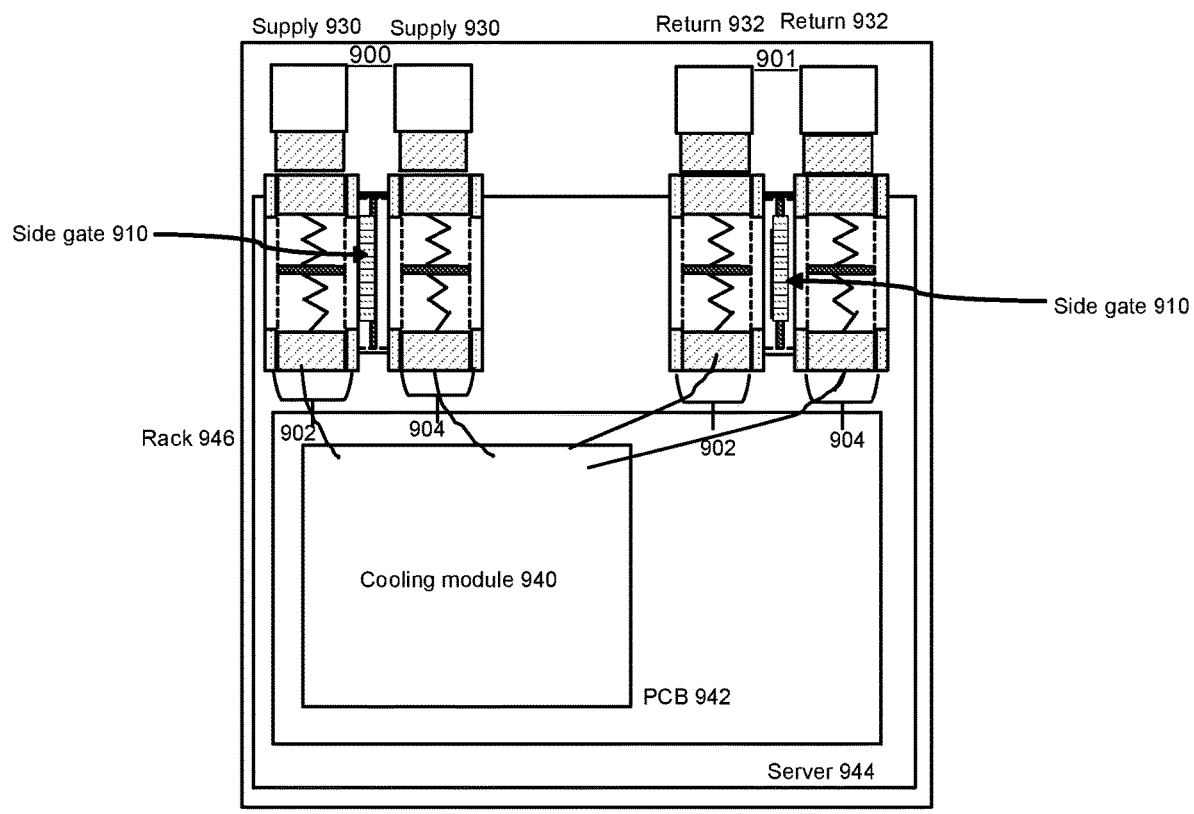
FIG. 9 is a schematic diagram illustrating a top view of an example of connector modules connected to a cooling module and double supply lines and double return lines according to one embodiment.

FIG. 9 is schematic illustrating a top view of an example of connector modules connected to a cooling module and double supply lines and double return lines according to one embodiment. It is noted that that both double supply lines and double return lines are in an active recirculating mode under a normal operating condition. Cooling module 940 may perform heat removal from the PCB 942 by functioning as a heat sink. The connector modules are used between the server chassis 944 and the rack manifold 946.

Referring to FIG. 9, the first bidirectional connector 902 and the second bidirectional connector 904 of the first set of the connector modules 900 are connected to the cooling module 940 while the side gate 910 is in the second position, thereby delivering the cooling fluid from the supply lines to the cooling module 940 via the first bidirectional connector 902 and the second bidirectional connector 904 of the first set of connector modules 900.

In one embodiment, for example, the first bidirectional connector 902 and the second bidirectional connector 904 of the second set of connector modules 901 are connected to the cooling module 940 while the side gate 910 is in the second position, thereby returning the cooling liquid carrying the heat back from the cooling module 940 to the rack fluid unit via the first bidirectional connector 902 and the second bidirectional connector 904 of the second set of connector modules 901.

Still referring to FIG. 9, described embodiments illustrate the connector module can be used for parallel distribution redundant. That is, during normal operation, the side gate 910 is closed and two fluid streams flowing from each of the supply lines 930 to the cooling module 940 via a first set of connector module 900 are separated. Similarly, two fluid streams flowing from the cooling module 940 to the return lines 932 via a second set of connector module 901 are separated. Once one of the fluid streams of the supply 930 or return lines 932 is cutoff, then the connector module converges the fluid stream from one end to the other, in one direction.

Figure 10:
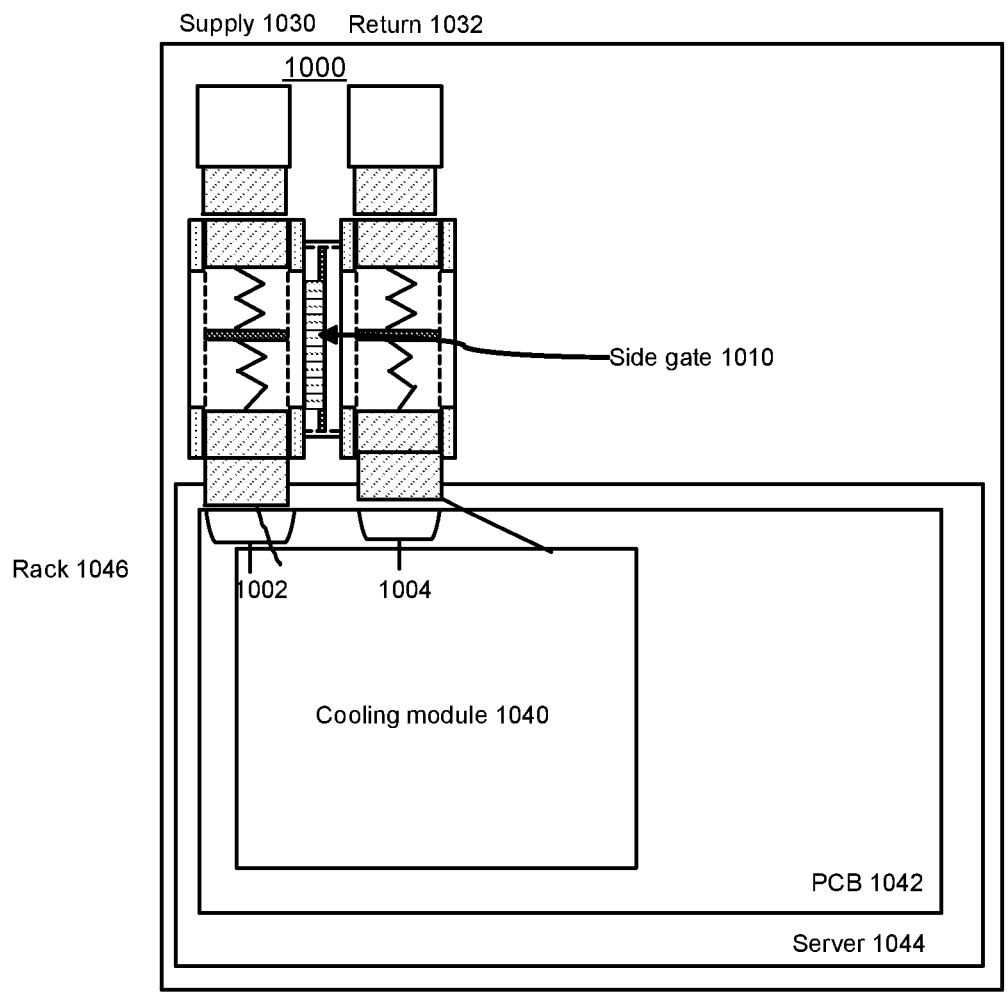
FIG. 10 is a schematic diagram illustrating a top view of an example of a connector module connected to a cooling module and a supply line and a return line according to one embodiment.

FIG. 10 is schematic illustrating a top view of an example of a connector module 1000 connected to a cooling module and a supply line and a return line according to one embodiment. Cooling module 1040 may perform heat removal from the PCB 1042 by functioning as a heat sink. The connector modules are used between the server chassis 1044 and the rack manifold 1046.

Referring to FIG. 10, the first bidirectional connector 1002 of connector modules 1000 is connected to one of the supply lines 1030. The second bidirectional connector 1004 of the connector modules 1000 is connected to one of the return lines 1032. The first bidirectional connector 1002 and the second bidirectional connector 1004 are connected to the cooling module 1040 while the side gate 1010 is in the second position and the spring-actuated stoppers 1050 are in the fourth position, thereby circulating the cooling fluid from the one of the supply lines 1030 to the one of the return lines 1032.

As further illustrated in FIG. 10, the connector module 1000 is configured for a normal server operation, in which one supply 1030 and one return lines 1032 are used. As shown, the first bidirectional connector 1002 is connected to the supply line 1030 and the second bidirectional connector 1004 is connected to the return line 1032. In this example, the fluid pressure within the second bidirectional connector 1004 is lower than the fluid pressure within the first bidirectional connector 1002. Described embodiments enable using a same hardware module for different server operations. That is, the rack system can be identical for different servers with different liquid cooling design with redundant designs and operations. Described embodiments create an internal recirculating stream with more advanced control of the gate for some scenarios.

Figure 11:
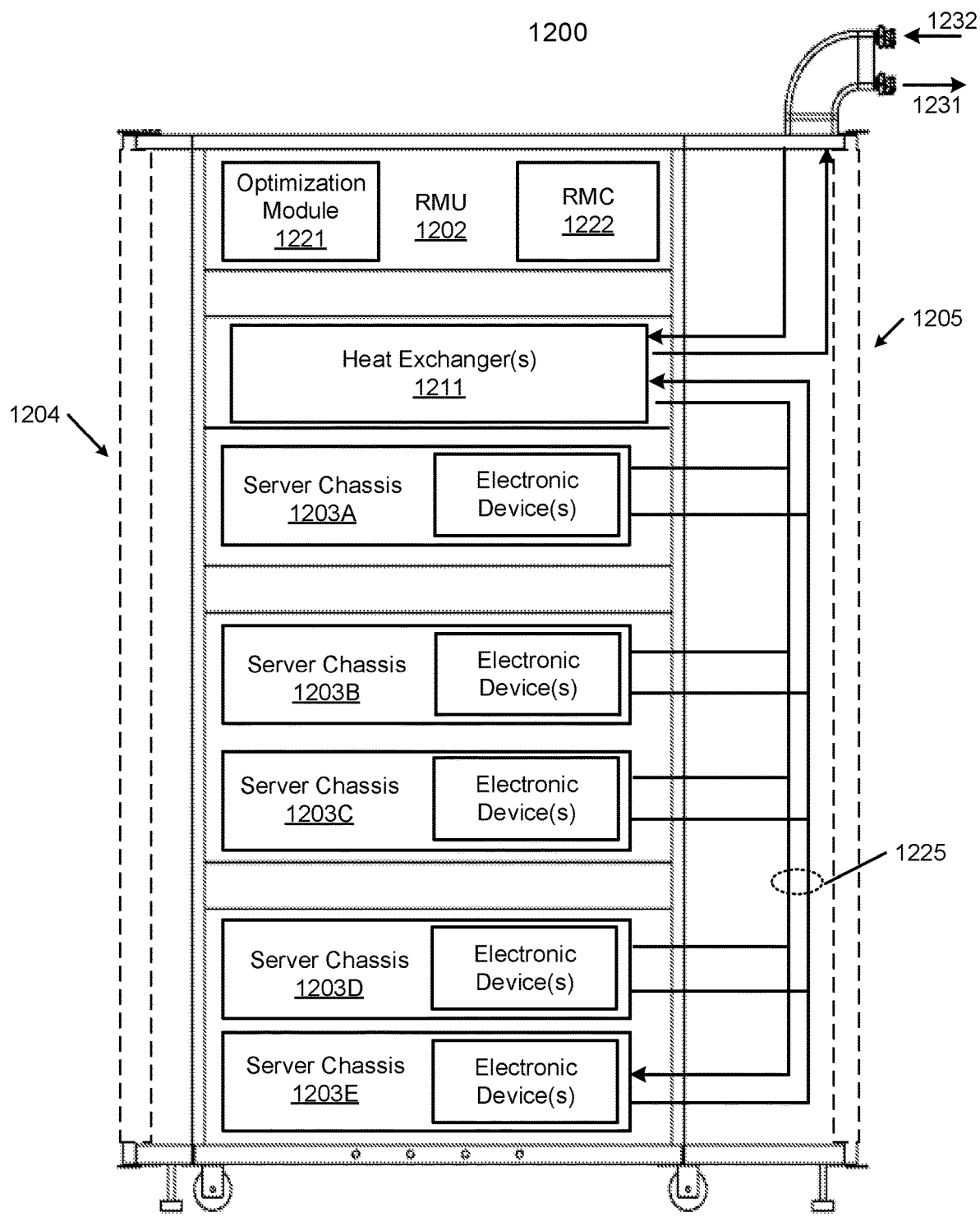
FIG. 11 is a schematic diagram illustrating an electronic rack according to one embodiment.

FIG. 11 is a block diagram illustrating an electronic rack according to one embodiment. Electronic rack 1200 may represent any of the electronic racks as described throughout this application. According to one embodiment, electronic rack 1200 includes, but is not limited to, heat exchanger 1211, rack management unit (RMU) 1202, and one or more server chassis 1203A-1203E (collectively referred to as server chassis 1203). Server chassis 1203 may represent any of the server chassis described throughout this application.

Server chassis 1203 can be inserted into an array of server slots (e.g., standard shelves) respectively from frontend 1204 or backend 1205 of electronic rack 1200. Note that although there are five server chassis 1203A-1203E shown here, more or fewer server chassis may be maintained within electronic rack 1200. Also note that the particular positions of heat exchanger 1211, RMU 1202, and/or server chassis 1203 are shown for the purpose of illustration only; other arrangements or configurations of heat exchanger 1211, RMU 1202, and/or server chassis 1203 may also be implemented. In one embodiment, electronic rack 1200 can be either open to the environment or partially contained by a rack container, as long as the cooling fans can generate airflows from the frontend to the backend.

In addition, for at least some of the server chassis 1203, an optional fan module (not shown) is associated with the server chassis. Each of the fan modules includes one or more cooling fans. The fan modules may be mounted on the backends of server chassis 1203 or on the electronic rack to generate airflows flowing from frontend 1204, traveling through the air space of the sever chassis 1203, and exiting at backend 1205 of electronic rack 1200.

In one embodiment, heat exchanger 1211 may be a liquid-to-liquid heat exchanger. Heat exchanger 1211 includes a first loop with inlet and outlet ports having a first pair of liquid connectors coupled to external liquid supply/return lines 1231-1232 to form a primary loop. The connectors coupled to the external liquid supply/return lines 1231-1232 may be disposed or mounted on backend 1205 of electronic rack 1200. The liquid supply/return lines 1231-1232, also referred to as room liquid supply/return lines, may be coupled to an external cooling system.

In addition, heat exchanger 1211 further includes a second loop with two ports having a second pair of liquid connectors coupled to rack manifold 1225 to form a secondary loop, which may include a supply manifold (also referred to as a rack liquid supply line or rack supply manifold) to supply cooling liquid to server chassis 1203 and a return manifold (also referred to as a rack liquid return line or rack return manifold) to return warmer liquid back to heat exchanger 1211. Note that heat exchanger 1211can be any kind of heat exchangers commercially available or customized ones. Thus, the details of heat exchanger 1211 will not be described herein.

Each of server chassis 1203 may include one or more information technology (IT) components (e.g., electronic devices such as processors, memory, and/or storage devices). In one embodiment, in at least some of the server chassis 1203, an electronic device may be attached to a cold plate (also referred to as a cooling plate). The cold plate includes a liquid distribution channel to receive cooling liquid from the rack liquid supply line of rack manifold 1225. The cooling liquid performs heat exchange from the heat generated from the electronic device attached thereon. The cooling liquid carrying the exchanged heat is returned to the rack liquid return line of rack manifold 1225 and back to heat exchangers 1211. In one embodiment, at least some of the cold plates may be connected to a rack manifold using a multi-chamber connection module or connector as described above.

In another embodiment, some of the server chassis 1203 may include an immersion tank containing immersion cooling liquid therein. The electronic devices of the corresponding server(s) are at least partially submerged into the immersion cooling liquid. The immersion cooling liquid may be dielectric cooling fluid, which may be circulated between the immersion tanks and heat exchanger 1211. The cooling liquid may be a single-phase cooling liquid or two-phase cooling liquid (also referred to as phase-change cooling liquid). The two-phase cooling liquid evaporates from a liquid form into a vapor form when the temperature of the cooling liquid is above a predetermined temperature threshold (e.g., the boiling point of the cooling liquid). The vapor flows upstream via the vapor line from the corresponding server chassis to heat exchanger 1211. Heat exchanger 1211 may include a condenser to condense the vapor from the vapor form back to the liquid form, where the cooling liquid is then supplied back to the server chassis.

Note that some of the server chassis 1203 may be configured with single-phase liquid cooling, while other server chassis may be configured with two-phase liquid cooling. Even within a single server chassis, some of the IT components may be configured with single-phase liquid cooling, while other IT components may be configured with two-phase liquid cooling. Rack manifold 1225 may include a first rack manifold for single-phase cooling and a second rack manifold for two-phase cooling to be coupled to the same or different server chassis for different types of cooling. Some of the sever chassis 1203 may be configured with regular liquid and air cooling, while other server chassis may be configured with immersion cooling.

Some of the IT components may perform data processing tasks, where the IT components may include software installed in a machine-readable medium such as a storage device, loaded into a memory, and executed by one or more processors to perform the data processing tasks. Server chassis 1203 may include a host server (referred to as a host node) coupled to one or more compute servers (also referred to as computing nodes). The host server (having one or more central processing units or CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more graphics/general processing units or GPUs) managed by the host server. The compute servers perform the actual tasks, which may generate heat during the operations.

Electronic rack 1200 further includes optional RMU 1202 configured to provide and manage power supplied to servers 1203 and heat exchanger 1211. RMU 1202 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.,) to provide power to at least some of the remaining components of electronic rack 1200.

In one embodiment, RMU 1202 includes optional optimization module 1221 and rack management controller (RMC) 1222. RMC 1222 may include a monitor to monitor operating status of various components within electronic rack 1200, such as, for example, computing nodes 1203, heat exchanger 1211, and the fan modules. Specifically, the monitor receives operating data from various sensors representing the operating environments of electronic rack 1200. For example, the monitor may receive operating data representing temperatures of the processors, cooling liquid, and airflows, which may be captured and collected via various temperature sensors. The monitor may also receive data representing the fan power and pump power generated by one or more fan modules and liquid pumps, which may be proportional to their respective speeds. These operating data are referred to as real-time operating data. Note that the monitor may be implemented as a separate module within RMU 1202.

Based on the operating data, optimization module 1221 performs an optimization using a predetermined optimization function or optimization model to derive a set of optimal fan speeds for the fan modules and an optimal pump speed for a liquid pump, such that the total power consumption of the liquid pump and the fan modules reaches minimum, while the operating data associated with the liquid pump and cooling fans of the fan modules are within their respective designed specifications. Once the optimal pump speed and optimal fan speeds have been determined, RMC 1222 configures the liquid pump and cooling fans of the fan modules based on the optimal pump speeds and fan speeds.

As previously explained, an embodiment of the disclosure may be (or include) a non-transitory machine-readable medium (such as microelectronic memory) having stored thereon instructions, which program one or more data processing components (generically referred to here as a "processor") to perform cooling operations. In other embodiments, some of these operations might be performed by specific hardware components that contain hardwired logic. Those operations might alternatively be performed by any combination of programmed data processing components and fixed hardwired circuit components.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A server chassis of an electronic rack, comprising:
   one or more servers, each server having one or more electronic devices; and
   a plurality of cooling assemblies, each cooling assembly corresponding to one of the electronic devices, wherein each of the plurality of cooling assemblies comprises:
      a cooling module positioned on top of the electronic devices and configured to provide liquid cooling to the electronic devices of a corresponding server;
      a connector module coupled to the cooling module, the connector module comprising:
         a first bidirectional connector to fluidly interconnect between the server chassis and a rack manifold of the electronic rack;
         a second bidirectional connector to fluidly interconnect between the server chassis and the rack manifold of the electronic rack;
         a middle section positioned and connected between the first bidirectional connector and the second bidirectional connector, the middle section comprising:
            a side wall that separates the first bidirectional connector and the second bidirectional connector, and
            a side gate disposed on the side wall to place the first bidirectional connector and second bidirectional connector in fluid communication while in a first position and to fluidly isolate the first bidirectional connector from the second bidirectional connector while in a second position.

2. The server chassis of claim 1, wherein each cooling assembly further comprises:
   a plurality of supply lines extended from the rack manifold to supply the cooling liquid to the cooling module to exchange heat generated from the electronic devices of the server; and
   a plurality of return lines coupled to the cooling module to return the cooling liquid carrying the heat back to the rack manifold.

3. The server chassis of claim 2, wherein the first bidirectional connector is connected to a first supply line of the plurality of supply lines and the second bidirectional connector is connected to a second supply line of the plurality of supply lines, a fluid pressure in each of the first supply line and the second supply line being substantially the same, and the side gate is in the second position.

4. The server chassis of claim 2, wherein a first connector and a third connector are connected to a rack fluid unit, wherein second and fourth connectors are connected to the cooling module, wherein the first bidirectional connector and the second bidirectional connector are connected to the plurality of supply lines while the side gate is in the second position.

5. The server chassis of claim 2, wherein the plurality of supply lines comprise a main supply line and a backup supply line, the first bidirectional connector being connected to the main supply line, the second bidirectional connector being connected to the backup supply line, a first connector being closed sealing the first bidirectional connector from the main supply line, a fourth connector being closed sealing the second bidirectional connector from the cooling module, a second connector being open to fluidly connect the first bidirectional connector to the cooling module, a third connector being open to fluidly connect the second bidirectional connector to the backup supply line, and the side gate to be in the first position, thereby delivering the cooling fluid from the backup supply line to the cooling module via the first bidirectional connector when the main supply line is sealed from a rack fluid unit.

6. The server chassis of claim 2, wherein the plurality of return lines comprise a main return line and a backup return line, the first bidirectional connector being connected to the backup return line, the second bidirectional connector being connected to the main return line, a first connector being closed sealing the first bidirectional connector from the cooling module, a fourth connector being closed sealing the second bidirectional connector from the main return line, a second connector being open to fluidly connect the first bidirectional connector to the backup return line, a third connector being open to fluidly connect the second bidirectional connector to the cooling module, and the side gate to be in the first position, thereby returning the cooling liquid carrying the heat back from the cooling module to a rack fluid unit via the backup return line when the main return line is disconnected from the second bidirectional connector, and wherein a blocked main return line becomes unblocked, the fourth connector being configured to open to fluidly connect the second bidirectional connector to the main return line, the side gate configured to move to the second position to seal the second bidirectional connector from the first bidirectional connector, thereby returning the cooling liquid carrying the heat back from the cooling module to the rack fluid unit via the second bidirectional connector and the main return line.

7. The server chassis of claim 2, wherein a first set of the plurality of connector modules is connected to the plurality of supply lines, wherein a second set of the plurality of connector modules is connected to the plurality of return lines, the first bidirectional connector of the first set of the plurality of connector modules being connected to the cooling module, the second bidirectional connector of the second set of the plurality of connector modules being connected to the cooling module.

8. The server chassis of claim 7, the first bidirectional connector and the second bidirectional connector of the first set of the plurality of connector modules being connected to the cooling module while the side gate is in the second position, thereby delivering the cooling fluid from the plurality of supply lines to the cooling module via the first bidirectional connector and the second bidirectional connector of the first set of the plurality of connector modules, the first bidirectional connector and the second bidirectional connector of the second set of the plurality of connector modules being connected to the cooling module while the side gate is in the second position, thereby returning the cooling liquid carrying the heat back from the cooling module to a rack fluid unit via the first bidirectional connector and the second bidirectional connector of the second set of the plurality of connector modules.

9. The server chassis of claim 2, wherein the first bidirectional connector of the plurality of connector modules is connected to one of the plurality of supply lines, wherein the second bidirectional connector of the plurality of connector modules is connected to one of the plurality of return lines, the first bidirectional connector and the second bidirectional connector being connected to the cooling module while the side gate is in the second position and a plurality of spring-actuated stoppers are in a fourth position, thereby circulating the fluid from the one of the plurality of supply lines to the one of the plurality of return lines.

10. An electronic rack of a data center, comprising:
a rack manifold; and
a plurality of server chassis arranged in a stack, each of the server chassis comprising:
one or more servers, each server having one or more electronic devices; and
a plurality of cooling assemblies, each cooling assembly corresponding to one of the electronic devices, wherein each of the plurality of cooling assemblies comprises:
a cooling module positioned on top of the electronic devices and configured to provide liquid cooling to the electronic devices of a corresponding server;
a connector module coupled to the cooling module, the connector module comprising:
a first bidirectional connector to fluidly interconnect between the server chassis and the rack manifold;
a second bidirectional connector to fluidly interconnect between the server chassis and the rack manifold;
a middle section positioned and connected between the first bidirectional connector and the second bidirectional connector, the middle section comprising:
a side wall that separates the first bidirectional connector and the second bidirectional connector, and
a side gate disposed on the side wall to place the first bidirectional connector and second bidirectional connector in fluid communication while in a first position and to fluidly isolate the first bidirectional connector from the second bidirectional connector while in a second position.

11. The electronic rack of claim 10, wherein each cooling assembly further comprises:
a plurality of supply lines extended from the rack manifold to supply the cooling liquid to the cooling module to exchange heat generated from the electronic devices of the server; and
a plurality of return lines coupled to the cooling module to return the cooling liquid carrying the heat back to the rack manifold.

* * * * *